United States Patent
Li et al.

(10) Patent No.: US 7,598,114 B2
(45) Date of Patent: *Oct. 6, 2009

(54) SACRIFICIAL BENZOCYCLOBUTENE/NORBORNENE POLYMERS FOR MAKING AIR GAP SEMICONDUCTOR DEVICES

(75) Inventors: Youngfu Li, Midland, MI (US); Robert A. Kirchhoff, Midland, MI (US); Jason Q. Niu, Midland, MI (US); Kenneth L. Foster, Brighton, MI (US)

(73) Assignee: Dow Global Technologies Inc.

( * ) Notice: Subject to any disclaimer, the term of this patent is extended or adjusted under 35 U.S.C. 154(b) by 537 days.

This patent is subject to a terminal disclaimer.

(21) Appl. No.: 10/544,428

(22) PCT Filed: Jan. 30, 2004

(86) PCT No.: PCT/US2004/002659
§ 371 (c)(1), (2), (4) Date: Feb. 6, 2006

(87) PCT Pub. No.: WO2004/073018
PCT Pub. Date: Aug. 26, 2004

(65) Prior Publication Data
US 2006/0246681 A1 Nov. 2, 2006

(51) Int. Cl.
*H01L 51/40* (2006.01)

(52) U.S. Cl. ............ 438/99; 438/42; 438/274; 438/399; 257/E25.008

(58) Field of Classification Search ........ 257/466, 257/594, 622; 438/42, 274, 391, 99
See application file for complete search history.

(56) References Cited

U.S. PATENT DOCUMENTS

| | | | |
|---|---|---|---|
| 3,252,957 A | 5/1966 | Pledger, Jr. et al. | |
| 4,987,101 A | 1/1991 | Kaanta et al. | |
| 5,324,683 A | 6/1994 | Fitch et al. | |

(Continued)

FOREIGN PATENT DOCUMENTS

WO       WO 98/32169        7/1998

(Continued)

OTHER PUBLICATIONS

Kohl, et al. IEEE Electron Device Letters, vol. 21, No. 12, Dec. 2000, 557-559.

(Continued)

*Primary Examiner*—Wai-Sing Louie

(57) ABSTRACT

A method of forming an air gap within a semiconductor structure by the steps of: (a) using a sacrificial polymer to occupy a space in a semiconductor structure; and (b) heating the semiconductor structure to decompose the sacrificial polymer leaving an air gap within the semiconductor structure, wherein the sacrificial polymer of step (a) is: (a) a copolymer of 5-ethylidene-2-norbornene and vinylbenzocyclobutene (or a vinylbenzocyclobutene derivative); or (b) a copolymer of 5-ethylidene-2-norbornene and 5-(3benzocyclobutylidene)-2-norbornene; or (c) a polymer of 5-(3benzocyclobutylidene)-2-norbornene. In addition, a semiconductor structure, having a sacrificial polymer positioned between conductor lines, wherein the sacrificial polymer is: (a) a copolymer of 5-ethylidene-2-norbornene and vinylbenzocyclobutene (or a vinylbenzocyclobutene derivative); or (b) a copolymer of 5-ethylidene-2-norbornene and 5-(3benzocyclobutylidene)-2-norbornene; or (c) a polymer of 5-(3benzocyclobutylidene)-2-norbornene.

18 Claims, 2 Drawing Sheets

U.S. PATENT DOCUMENTS

Figure 1:
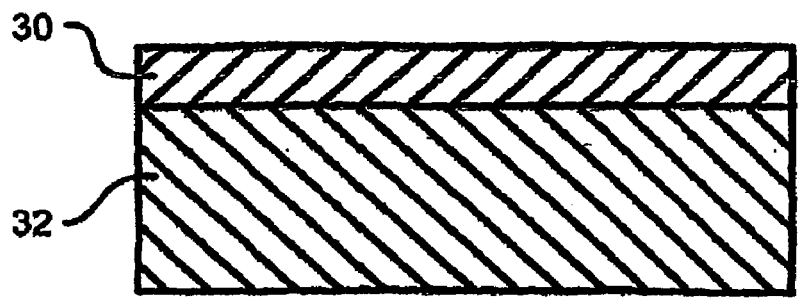

| | | | |
|---|---|---|---|
| 5,399,646 | A | 3/1995 | Kohara et al. |
| 5,461,003 | A | 10/1995 | Havermann et al. |
| 5,705,430 | A | 1/1998 | Avanzino et al. |
| 5,872,201 | A | 2/1999 | Cheung et al. |
| 6,013,413 | A | 1/2000 | Frechet et al. |
| 6,057,226 | A | 5/2000 | Wong |
| 6,071,805 | A | 6/2000 | Liu |
| 6,165,890 | A | 12/2000 | Kohl et al. |
| 6,346,484 | B1 | 2/2002 | Cotte et al. |
| 6,946,382 | B2 * | 9/2005 | Townsend et al. ........... 438/619 |
| 6,949,456 | B2 | 9/2005 | Kumar |
| 2003/0219973 | A1 | 11/2003 | Townsend, III et al. |

FOREIGN PATENT DOCUMENTS

WO   WO 02/19420 A2   3/2002

OTHER PUBLICATIONS

IBM Technical Disclosure Bulletin, vol. 38, No. 9 Sep. 1995, 137-140.

Kirchhoff et al., Prog. Polym. Sci. vol. 18, 85-185, 1993.

Bonjouklian et al., J. Org. Chem., vol. 42, 4095, 1977.

Chino et al., J. of Polym. Sci: Part A: Polymer Chemistry, vol. 37, pp. 59-67, 1999.

* cited by examiner

SACRIFICIAL BENZOCYCLOBUTENE/NORBORNENE POLYMERS FOR MAKING AIR GAP SEMICONDUCTOR DEVICES

The invention herein described relates generally to the fabrication of semiconductor devices and more specifically to such devices that use air gaps to reduce capacitive coupling between conductors in such devices.

As a consequence of the progress made in integrated circuit technology, the spacing between the metal lines on any given plane of an integrated circuit has become less and less, now extending into the submicrometer range. By reducing the spacing between conductive members in the integrated circuit, an increase in capacitive coupling occurs. This increase in capacitive coupling causes greater crosstalk, higher capacitive losses and increased RC time constant.

In order to reduce capacitive coupling, much effort has been directed toward developing low dielectric constant (low-K) materials to replace conventional dielectric materials that are interposed between the metal lines on a given layer and between layers. Many conventional electronic insulators have dielectric constants in the 3.5 to 4.2 range. For example, silicon dioxide has a dielectric constant of 4.2 and polyimides typically have dielectric constants from 2.9 to 3.5. Some advanced polymers have dielectric constants in the 2.5 to 3.0 range. Materials in the 1.8 to 2.5 range are also known.

The lowest possible, or ideal, dielectric constant is 1.0, which is the dielectric constant of a vacuum. Air is almost as good with a dielectric constant of 1.001. With this recognition of the low dielectric constant of air, attempts have been made to fabricate semiconductor devices with air gaps between metal leads to reduce the capacitive coupling between the electrically conducting members. The air gap forming techniques that have been developed have varying degrees of complexity and include subtractive and damascene techniques.

U.S. Pat. No. 4,987,101 describes a method and structure for providing an insulating electrical space between two lines on a layer of material or between lines on adjacent superposed layers of material. A base member is formed having a plurality of support members extending upwardly from the base member. A removable material is deposited on the base member and around the support members. A cap member of insulating material is then deposited over said support members and the removable material. Access openings are formed in at least one of the base member or the cap member communicating with the removable material. The removable material is removed through the access openings to thereby define a space between the cap member and is the base member and between the support members. During this step a partial vacuum (in which some inert gas may be dispersed) may be created in the space vacated by the removable material. The access openings are then filled in so as to provide a sealed space between the cap member which has a very low dielectric constant.

U.S. Pat. No. 5,324,683 describes several techniques for forming air gaps or regions in a semiconductor device. The air regions are formed by either selectively removing a sacrificial spacer or by selectively removing a sacrificial layer. The air regions are sealed, enclosed or isolated by either a selective growth process or by a non-conformal deposition technique. The air regions may be formed under any pressure, gas concentration or processing condition.

The techniques disclosed in the aforesaid patents rely on holes or other passageways for effecting removal of the sacrificial material. In U.S. Pat. No. 5,461,003, a sacrificial material is removed through a porous dielectric layer. According to this patent, metal leads are formed on a substrate, after which a disposable solid layer is deposited on the metal leads and substrate. The disposable solid layer is then etched back to expose the tops of the metal leads. Then a porous dielectric layer is deposited over the metal leads and disposable layer. This is followed by removal of the disposable layer which is said to be preferably accomplished by exposing the device to oxygen or oxygen-plasma at a high temperature (greater than 100 degrees Celsius) to vaporize, or burn off, the disposable layer. The oxygen moves through the porous dielectric layer to reach and react with the disposable layer and thereby convert it to a gas that moves back out of the porous dielectric layer. Upon removal of the disposable layer, air gaps are left. Finally, a non-porous dielectric layer is deposited on top of the porous dielectric layer to seal the porous dielectric layer from moisture, provide improved structural support and thermal conductivity, and passivate the porous dielectric layer. This procedure results in an air gap that does not extend the full height of the adjacent metal leads or lines. The '003 patent discloses a modified method to remedy this problem and to increase the process margin. This modified method involves a further process step wherein an oxide layer is formed on top of the metal leads so that the disposable dielectric layer can extend higher than the metal leads.

It is also noted that the exposure of the device to oxygen plasma which must diffuse through a porous layer is not only inefficient, it also exposes other elements of the device to potentially damaging oxygen plasma for an extended period of time. In particular, exposure of oxygen plasma to copper lines can prove deleterious. Copper is becoming an increasingly important metal in semiconductor manufacturing due to its lower resistivity when compared to aluminum.

In U.S. Pat. No. 6,165,890 a sacrificial norbornene polymer is used between the metal lines of a semiconductor device and then the device is heated to decompose and vaporize said polymer leaving an air gap between said metal lines. Kohl, et al., IEEE Electron Device Letters, Vol. 21, No. 12, December 2000, p 557-559 teach that critical material properties of such a sacrificial polymer include: (a) a glass transition temperature sufficiently high to provide dimensional stability during processing (e.g., greater than 350 degrees Celsius); (b) a sufficiently slow decomposition rate to mitigate problems of pressure build-up during air gap formation; (c) no objectionable residue after decomposition; and (d) a temperature of decomposition sufficiently low (e.g., 450 degrees Celsius) to mitigate device damage that may occur at higher temperatures. Many polymers are not suitable for such an application, IBM Technical Disclosure Bulletin, Vol. 38, No. 9 Sep. 1995, p 137-140.

A method of forming an air gap within a semiconductor structure comprising the steps of: (a) using a sacrificial polymer to occupy a space in a semiconductor structure; and (b) heating the semiconductor structure to decompose the sacrificial polymer leaving an air gap within the semiconductor structure, wherein the sacrificial polymer is a polymer or copolymer comprising the following monomers: 5-ethylidene-2-norbornene and vinylbenzocyclobutene (or a vinylbenzocyclobutene derivative); or (b) 5-ethylidene-2-norbornene and 5-(3-benzocyclobutylidene)-2-norbornene; or (c) 5-(3-benzocyclobutylidene)-2-norbornene. In addition, a semiconductor structure, comprising a sacrificial polymer positioned between conductor lines, wherein the sacrificial polymer is a polymer or copolymer comprising the following monomers: 5-ethylidene-2-norbornene and vinylbenzocyclobutene (or a vinylbenzocyclobutene derivative); or (b)

5-ethylidene-2-norbornene and 5-(3-benzocyclobutylidene)-2-norbornene; or (c) 5-(3-benzocyclobutylidene)-2-norbornene.

FIGS. 1-6 are diagrammatic cross-sections of a portion of a semiconductor structure, illustrating several steps of a method according to an aspect of the instant invention.

In one embodiment the instant invention is a method of forming an air gap within a semiconductor structure comprising the steps of: (a) using a sacrificial polymer to occupy a space in a semiconductor structure; (b) heating the semiconductor structure to decompose the sacrificial polymer leaving an air gap within the semiconductor structure, wherein the sacrificial polymer of step (a) is: (1) a copolymer comprising a first monomer of 5-ethylidene-2-norbornene and a second monomer of vinylbenzocyclobutene or a vinylbenzocyclobutene derivative; or (2) a copolymer comprising a first monomer of 5-ethylidene-2-norbornene and a second monomer of 5-(3-benzocyclobutylidene)-2-norbornene; or (3) a polymer comprising monomers of 5-(3-benzocyclobutylidene)-2-norbornene. The term "derivative of vinylbenzocyclobutene" means that one or more of the hydrogens of vinylbenzocyclobutene are replaced with an alkyl, aryl, alkylaryl or hetero atom group(s) which may be mono or multisubstituted with functional groups such as nitro, amino, cyano, carbonyl and carboxyl. The term "vinybenzolcyclobutene" means bicyclo[4.2.0]octa-1,3,5-trene, 2-ethenyl and bicyclo[4.2.0]octa-1,3,5-triene, 3-ethenyl, i.e, the ethylene group is attached to the benzene ring and not the cyclobutene ring.

Formula (a) below shows the schematic chemical formula for 4-vinylbenzocyclobuetne wherein hydrogen atoms are assumed.

Formula (b) shows the schematic chemical formula for 5-ethylidene-2-norbornene wherein hydrogen atoms are assumed.

Formula (c) shows the schematic chemical formula for 5-(3-benzocyclobutylidene)-2-norbornene wherein hydrogen atoms are assumed.

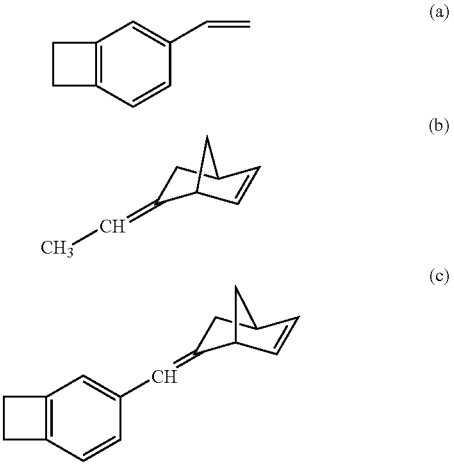

The relative amount of the above-described monomers used in the polymer of the instant invention depends on the glass transition temperature and decomposition temperature that is desired. When the polymer contains more vinylbenzocyclobutene or a vinylbenzocyclobutene derivative then the copolymer will tend to have a higher glass transition temperature and a higher decomposition temperature. The highly preferred polymers of the instant invention have a glass transition temperature prior to benzocyclobutene cure of about 200 degrees Celsius, a glass transition temperature after benzocyclobutene cure of about 350 degrees Celsius and a decomposition temperature of about 450 degrees Celsius.

The full scope of the instant invention is realized when the sacrificial polymer comprises a first monomer (such as a norbornene type monomer) selected to give the polymer the desired decomposition temperature and a second monomer (such as a vinylbenzocyclobutene type monomer) selected to give the polymer the desired glass transition temperature; or a monomer selected to provide both such properties (such as a monomer incorporating a norbornene group and a benzocyclobutene group).

Using this approach, it is possible to obtain a polymer having a decomposition and glass transition temperature tailored to the specific temperature requirements for processing air gap semiconductor structures.

The polymers of the instant invention are dispersable in common solvents, such as toluene, xylenes or mesitylene. Dispersions of the copolymers of the instant invention in such solvents can be used to apply the polymers of the instant invention to a semiconductor structure by any suitable coating technique, for example by spin coating.

Figure 2:
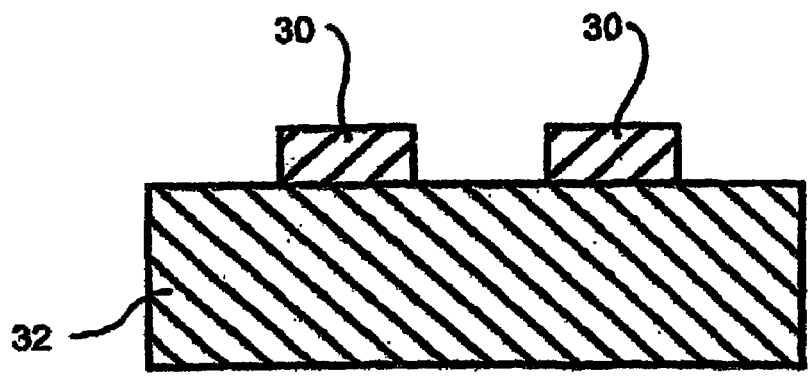

Referring now to FIGS. 1-6, wherein is shown diagrammatic cross-sections of a portion of a semiconductor structure, illustrating several steps of a method according to one aspect is of the instant invention. In FIGS. 1 and 2 a patterned layer of sacrificial polymer 30 of the instant invention is formed on a substrate 32. The substrate 32 may have patterns already on it, or it may be an unpatterned material. The substrate may be a base layer or a layer of material overlaying a base layer such as an insulating layer of silicon dioxide that may overlie the devices on an integrated circuit chip (not shown). By way of specific example, the substrate may be a semiconductor wafer that may, for example, contain transistors, diodes, and other semiconductor elements (as are well known in the art).

As depicted in FIG. 1, a relatively uniform layer of the sacrificial polymer 30 is deposited on the substrate 32. This may be done in any suitable manner, for example, by spin coating, spraying, meniscus, extrusion or other coating methods, by pressing or laying a dry film laminate onto the substrate, etc.

In FIG. 2, the layer of sacrificial polymer is patterned to produce the patterned layer of the sacrificial polymer 30, the pattern of which corresponds to the desired pattern of one or more air gaps to be formed in the semiconductor device. Any suitable technique can be used to pattern the layer of sacrificial polymer, including, for example, laser ablating, etching, etc. The sacrificial polymer may be made photosensitive to facilitate patterning.

Figure 3:
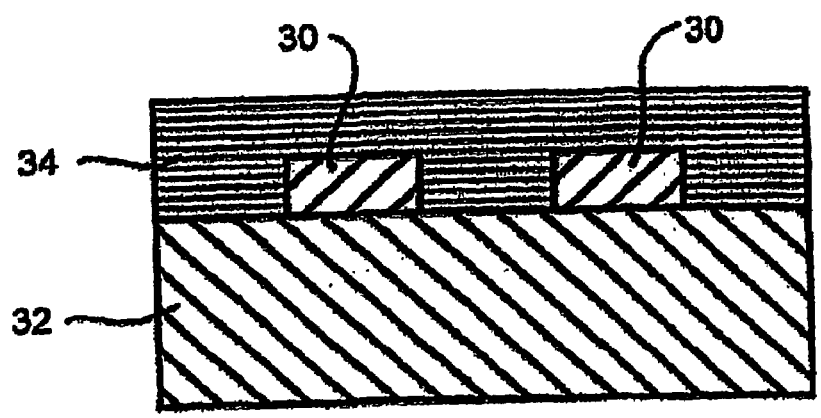

In FIG. 3, a layer of conductive material 34, usually a metal such as copper or aluminum is deposited over the patterned layer of sacrificial polymer 30. This may be done by any suitable technique including, for example, metal sputtering, chemical vapor deposition (CVD), physical vapor deposition (PVD), electroplating, electroless plating, etc.

Figure 4:
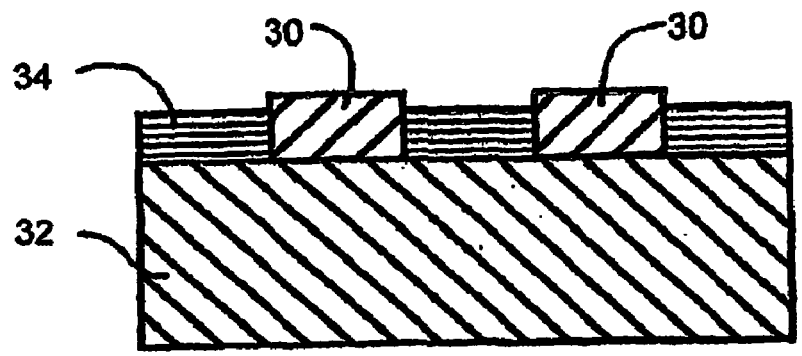

In FIG. 4, the layer 34 is planarized if needed by any suitable technique including, for example, chemical mechanical polishing (CMP). If CMP is used, an etch stop (such as a layer of silicon dioxide or other suitable material) is preferably applied to the surface of the sacrificial polymer.

Figure 5:
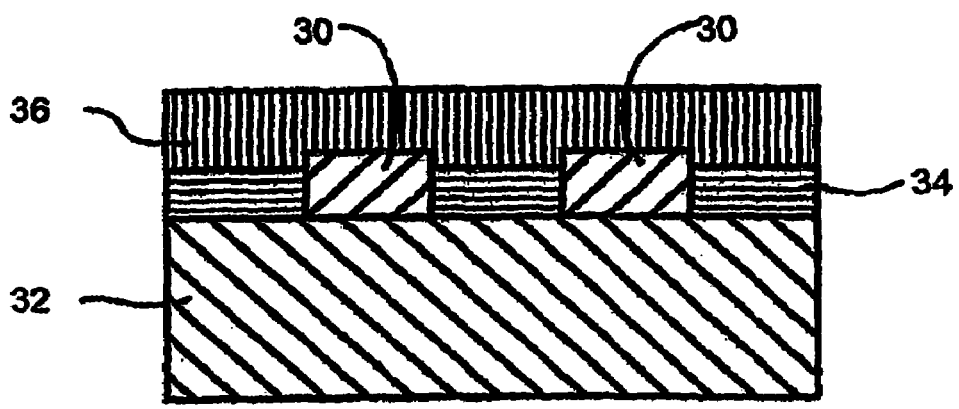

In FIG. 5, a permanent dielectric 36 is deposited over the patterned layer of sacrificial polymer 30 with the metal inlay 34. The permanent dielectric 36 is deposited as a solid layer and covers the sacrificial layer 30 and at least the tops of the metal leads 34. The permanent dielectric layer may be planarized before or after removal of the sacrificial material. The permanent dielectric layer, for example, may be silicon dioxide, polyimide or other material. The permanent dielectric layer may be deposited by spin coating, spray coating or meniscus coating, chemical vapor deposition, plasma enhanced chemical vapor deposition, sol-gel process, or other method.

As seen in FIG. 5, the metal layer can be conveniently formed with a height less than the height of the adjacent sacrificial material. As will be appreciated, this will result in air gaps that extend above the tops of the metal leads, as is desirable to reduce capacitive coupling. Also, the substrate could have trenches formed therein in a pattern corresponding to the pattern of the sacrificial material, so that the resultant air gaps will extend below the metal leads located on lands on the substrate between the trenches.

Figure 6:
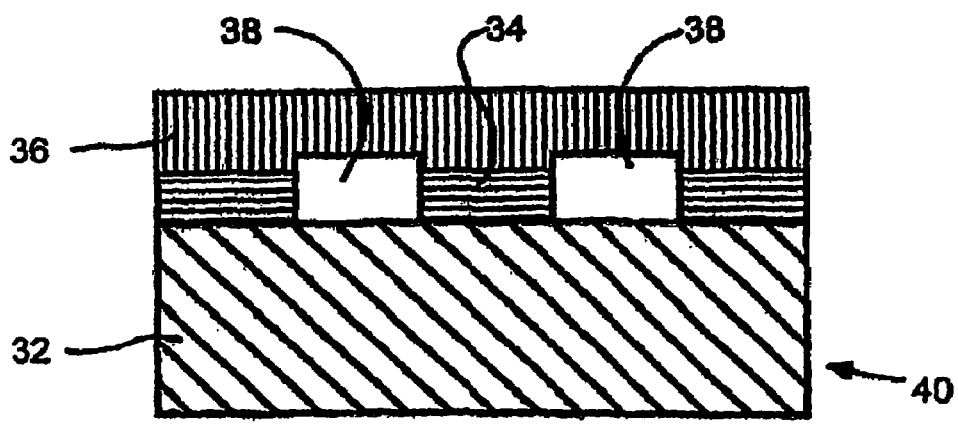

The sacrificial polymer 30 is removed through the permanent dielectric layer 36 to form the air gaps 38 shown in FIG. 6. The removal of the sacrificial polymer preferably is accomplished by thermal decomposition and passage of one or more of the decomposition products through the permanent dielectric layer 36 by diffusion. An important benefit of a polymer of the instant invention is that the molecular weight of the degraded polymer is relatively low, thereby facilitating removal of the degradation products from the semiconductor structure. As above indicated, polymers of the instant invention can undergo thermal decomposition at temperatures on the order of about 450 degrees Centigrade, and lower, with essentially no residue being left in the air gaps of the resultant semiconductor structure 40. Also, the decomposition products are diffusible through many dielectric materials useful in forming the permanent dielectric layer, including in particular polyimides.

The rate of decomposition should be slow enough so that diffusion through the permanent dielectric will occur. Diffusion typically arises from a pressure buildup within the air gap. This pressure build up should not be so great as to exceed the mechanical strength of the permanent dielectric. Increased temperature will generally aid diffusion as diffusivity of gas through the permanent dielectric will normally increase with temperature.

As will be appreciated, the air gaps may contain residual gas from the decomposition although generally such residual gas will eventually exchange with air. However, steps may be taken to prevent such exchange, or dispose a different gas (a noble gas for example) or a vacuum in the air gaps. For example, the semiconductor structure may be subjected to vacuum conditions to extract any residual gas from the air gaps by diffusion or otherwise after which the semiconductor structure may be coated by a suitable sealing material. Before the semiconductor structure is sealed, it may be subjected to a controlled gas atmosphere, such as one containing a noble gas, to fill the air gaps with such gas. Further processing steps may be performed on the semiconductor structure 40, for example to form additional layer(s) of interconnection in the semiconductor device having air gaps above and below conductor lines as well as air gaps on the sides of conductor lines. Thus, the polymer of the instant invention may be decomposed as a single layer before each next interconnect level is built or the polymer of the instant invention may be decomposed in multiple layers simultaneously after multiple interconnect levels have been built. Preferably, the entire multiple layer interconnect structure is built and the polymer of the instant invention is decomposed simultaneously. However, thermal decomposition is the preferred technique.

The method of the instant invention is not limited to the specific steps outlined above with reference to FIGS. 1-6. U.S. Pat. No. 6,165,890, for example, shows a number of specific steps for forming air gaps in semiconductor structures using sacrificial polymers and the polymers of the instant invention are also applicable to the steps and structures outlined in the '890 patent. The critical aspect of the instant invention is the sacrificial polymer.

In another embodiment, the instant invention is a semiconductor structure comprising a sacrificial polymer positioned between conductor lines, wherein the sacrificial polymer is polymer of the instant invention. FIG. 5 shows such a structure.

EXAMPLE 1

A one hundred milliliter round bottom flask is equipped with a magnetic stirring bar, a thermometer, a gas inlet adapter and a septum. The flask is heated to 110 degrees Celsius and dried with a stream of dry nitrogen. The flask is then cooled in an ice/water bath. 14 milliliters of dry methylene chloride is added to the flask. 4.8 grams of 5-ethylidene-2-norbornene and 1.2 g of 3-vinylbenzocyclobutene are added to the flask. Then, 0.4 grams of trifluoroboron etherate are added dropwise to initiate the polymerization. After twenty minutes, the flask is brought to room temperature. The polymer produced in the flask is precipitated in methanol, dried, dissolved in tetrahydrofuran, precipitated again in methanol and then dried to yield 5.6 grams of polymer.

Gel Permeation Chromatography analysis indicates that the weight average molecular weight of the dried polymer is 9,040 grams per mole compared to polystyrene standards and that the number average molecular weight of the dried polymer is 2,850 grams per mole compared to polystyrene standards, and with a polydispersity of 3.17. Differential Scanning Calorimitery shows a glass transition temperature of 200 degrees Celsius prior to benzocyclobutene cure, then a glass transition temperature of 350 degrees Celsius after curing at 280 degrees Celsius (the cyclobutene group on the polymer opens at 280 degrees Celsius and cross-links the polymer by way of reaction with a neighboring cyclobutene group, see Kirchhoff et al., Prog. Polym. Sci. Vol 18, 85-185, 1993, the cyclobutene rings on the benzocyclobutene moieties begin to undergo ring opening at a significant rate at 200 degrees Celsius with a polymerization exotherm maximum temperature at 250-280 degrees Celsius). The dried polymer (uncured) is dissolved in thirteen grams of mesitylene and filtered through a one micron pore size filter. Two milliliters of the filtered polymer solution is spin coated (3,500 rpm) on a semiconductor substrate to produce a system like that shown in FIG. 1 which is then processed as shown in FIGS. 2-6 to produce a semiconductor device having air gaps.

EXAMPLE 2

A fifty milliliter round bottom flask is equipped with a magnetic stirring bar, a thermometer, a gas inlet adapter and a septum. The flask is heated to 110 degrees Celsius and dried with a stream of dry nitrogen. The flask is then cooled in an ice/water bath. 14 milliliters of dry methylene chloride is added to the flask. 3.0 grams of 5-ethylidene-2-norbornene and 3.0 g of 3-vinylbenzocyclobutene are added to the flask. Then, 0.1 grams of trifluoroboron etherate are added dropwise to initiate the polymerization. After twenty minutes, the flask is brought to room temperature. The polymer produced in the flask is precipitated in methanol, dried, dissolved in tetrahydrofuran, precipitated again in methanol and then dried to yield 4.0 grams of polymer.

Gel Permeation Chromatography analysis indicates that the weight average molecular weight of the dried polymer is 5,420 grams per mole compared to polystyrene standards and that the number average molecular weight of the dried polymer is 2,100 grams per mole compared to polystyrene standards, and with a polydispersity of 2.58. Differential Scanning Calorimetry shows a glass transition temperature of 200 degrees Celsius prior to benzocyclobutene cure, then a glass transition temperature of 350 degrees Celsius after curing at 280 degrees Celsius (the cyclobutene group on the polymer opens at 280 degrees Celsius and cross-links the polymer by way of reaction with a neighboring cyclobutene group, see Kirchhoff et al., Prog. Polym. Sci. Vol 18, 85-185, 1993, the cyclobutene rings on the benzocyclobutene moieties begin to undergo ring opening at a significant rate at 200 degrees Celsius with a polymerization exotherm maximum temperature at 250-280 degrees Celsius). The dried polymer (uncured) is dissolved in nine grams of mesitylene and filtered through a one micron pore size filter. Two milliliters of the filtered polymer solution is spin coated (3,500 rpm) on a semiconductor substrate to produce a system like that shown in FIG. 1 which is then processed as shown in FIGS. 2-6 to produce a semiconductor device having air gaps.

EXAMPLE 3

The following monomers were either obtained from commercial sources or synthesized based on the known literature (J. Org. Chem., Vol 42, 4095, 1977):

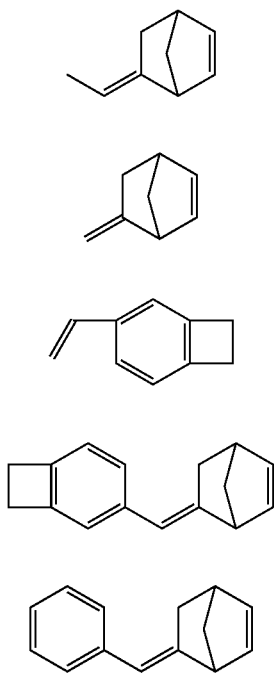

Monomers (d) and (e) are prepared in following steps:

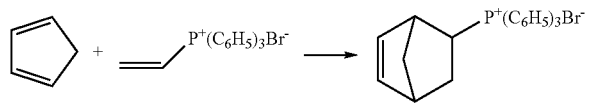

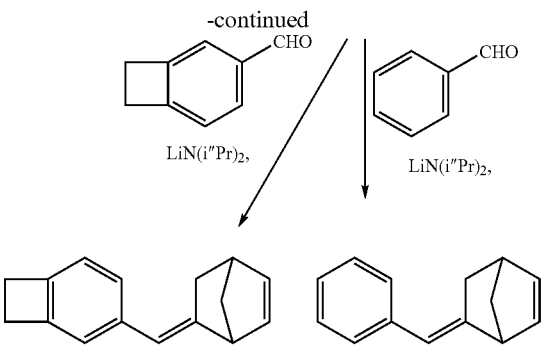

Vinyltriphenylphosphonium bromide undergoes Diels-Alder reaction with cyclopentadiene to afford the desired cycloadduct. This cycloadduct is recovered as powder after recrystallization. This new phosphonium salt is converted to the product by treatment with lithium diisopropylamide at $-78°$ C. in tetrahydronfuran. Addition of a slight excess of benzaldehyde (for monomer (e)) or BCB aldehyde (for monomer (d)) at $0°$ C. followed by warming to room temperature produced the alkylidene monomer (d) and (e) respectively.

Monomer (a) is 5-ethylidene-2-norbornene. Monomer (b) is 5-methylene-2-norbornene. Monomer (c) is 5 vinylbenzocyclobutene. Monomer (d) is 5-(3-benzocyclobutylidene)-2-norbornene. Monomer (a) and (b) are commercially available from Aldrich Chemical Company.

EXAMPLE 4

A 250 milliliter three necked round bottom flask is equipped with a magnetic stirring bar, a thermometer, a gas inlet adapter and a septum. The flask is heated to 110 degrees Celsius and dried with a stream of dry nitrogen. The flask is then cooled in an ice/water bath. 28 milliliters of dry methylene chloride is added to the flask. 9.6 grams of 5-methylene-2-norbornene and 2.4 grams of 3-vinylbenzocyclobutene are added to the flask. Purged with dry nitrogen for 15-20 minutes, and then 0.5 grams of trifluoroboron etherate are added by dropwise to initiate the polymerization. After forty minutes, the flask is brought to room temperature. The polymer produced in the flask is precipitated in methanol, dried, dissolved in tetrahydrofuran, precipitated again in methanol and then dried to yield 8.9 grams of polymer.

Gel Permeation Chromatography analysis indicates that the weight average molecular weight of the dried polymer is 6,753 grams per mole compared to polystyrene standards and that the number average molecular weight of the dried polymer is 2,421 grams per mole compared to polystyrene standards, and with a polydispersity of 2.79. Differential Scanning Calorimetry shows a glass transition temperature of 200 degrees Celsius prior to benzocyclobutene cure, then a glass transition temperature of 350 degrees Celsius after curing at 280 degrees Celsius (the cyclobutene group on the polymer opens at 280 degrees Celsius and cross-links the polymer by way of reaction with a neighboring cyclobutene group, see Kirchhoff et al., Prog. Polym. Sci. Vol 18, 85-185, 1993, the cyclobutene rings on the benzocyclobutene moieties begin to undergo ring opening at a significant rate at 200 degrees Celsius with a polymerization exotherm maximum temperature at 250-280 degrees Celsius). The dried polymer (uncured) is dissolved in ten grams of mesitylene and filtered through a one micron pore size filter. Two milliliters of the filtered polymer solution is spin coated (3,500 rpm) on a semiconductor substrate to produce a system like that shown in FIG. 1 which is then processed as shown in FIGS. 2-6 to produce a semiconductor device having air gaps.

What is claimed is:

1. A method of forming an air gap within a semiconductor structure comprising the steps of: (a) using a sacrificial polymer to occupy a space in a semiconductor structure; (b) heating the semiconductor structure to decompose the sacrificial polymer leaving an air gap within the semiconductor structure, wherein the sacrificial polymer of step (a) is selected from the group consisting of a copolymer comprising a first monomer of 5-ethylidene-2-norbornene and a second monomer of vinylbenzocyclobutene or a vinylbenzocyclobutene derivative.

2. The method of claim 1, wherein the sacrificial polymer is a copolymer comprising from 99 to 40 mole percent 5-ethylidene-2-norbornene and from 1 to 60 mole percent vinylbenzocyclobutene or a vinylbenzocyclobutene derivative based on total moles of incorporated monomers in the polymer.

3. The method of claim 1, wherein the sacrificial polymer is a copolymer comprising from 85 to 55 mole percent 5-ethylidene-2-norbornene and from 15 to 45 mole percent vinylbenzocyclobutene or a vinylbenzocyclobutene derivative based on total moles of incorporated monomers in the polymer.

4. The method of claim 1, wherein the sacrificial polymer is a copolymer comprising about 70 mole percent 5-ethylidene-2-norbornene and about 30 mole percent of vinylbenzocyclobutene or a vinylbenzocyclobutene derivative based on total moles of incorporated monomers in the polymer.

5. The method of claim 1, wherein the sacrificial polymer is a copolymer consisting essentially of from 99 to 40 mole percent 5-ethylidene-2-norbornene and from 1 to 60 mole percent vinylbenzocyclobutene or a vinylbenzocyclobutene derivative based on total moles of incorporated monomers in the polymer.

6. The method of claim 1, wherein the sacrificial polymer is a copolymer consisting essentially of from 85 to 55 mole percent 5-ethylidene-2-norbornene and from 15 to 45 mole percent vinylbenzocyclobutene or a vinylbenzocyclobutene derivative based on total moles of incorporated monomers in the polymer.

7. The method of claim 1, wherein the sacrificial polymer is a copolymer consisting essentially of about 70 mole percent 5-ethylidene-2-norbornene and about 30 mole percent vinylbenzocyclobutene or a vinylbenzocyclobutene derivative based on total moles of incorporated monomers in the polymer.

8. A method of forming an air gap within a semiconductor structure comprising the steps of: (a) using a sacrificial polymer to occupy a space in a semiconductor structure; (b) heating the semiconductor structure to decompose the sacrificial polymer leaving an air gap within the semiconductor structure, wherein the sacrificial polymer of step (a) is a copolymer comprising a first monomer of 5-ethylidene-2-norbornene and a second monomer of 5-(3-benzocyclobutylidene)-2-norbornene.

9. The method of claim 8, wherein the sacrificial polymer is a copolymer comprising from 99 to 40 mole percent 5-ethylidene-2-norbornene and from 1 to 60 mole percent 5-(3-benzocyclobutylidene)-2-norbornene based on total moles of incorporated monomers in the polymer.

10. The method of claim 8, wherein the sacrificial polymer is a copolymer comprising from 85 to 55 mole percent 5-ethylidene-2-norbornene and from 15 to 45 mole percent 5-(3-benzocyclobutylidene)-2-norbornene based on total moles of incorporated monomers in the polymer.

11. The method of claim 8, wherein the sacrificial polymer is a copolymer comprising about 70 mole percent 5-ethylidene-2-norbornene and about 30 mole percent of 5-(3-benzocyclobutylidene)-2-norbornene based on total moles of incorporated monomers in the polymer.

12. The method of claim 8, wherein the sacrificial polymer is a copolymer consisting essentially of from 99 to 40 mole percent 5-ethylidene-2-norbornene and from 1 to 60 mole percent 5-(3-benzocyclobutylidene)-2-norbornene based on total moles of incorporated monomers in the polymer.

13. The method of claim 8, wherein the sacrificial polymer is a copolymer consisting essentially of from 85 to 55 mole percent 5-ethylidene-2-norbornene and from 15 to 45 mole percent 5-(3-benzocyclobutylidene)-2-norbornene based on total moles of incorporated monomers in the polymer.

14. The method of claim 8, wherein the sacrificial polymer is a copolymer consisting essentially of about 70 mole percent 5-ethylidene-2-norbornene and about 30 mole percent 5-(3-benzocyclobutylidene)-2-norbornene based on total moles of incorporated monomers in the polymer.

15. A method of forming an air gap within a semiconductor structure comprising the steps of: (a) using a sacrificial polymer to occupy a space in a semiconductor structure; (b) heating the semiconductor structure to decompose the sacrificial polymer leaving an air gap within the semiconductor structure, wherein the sacrificial polymer of step (a) is a polymer comprising monomers of 5-(3-benzocyclobutylidene)-2-norbornene.

16. The method of claim 15, wherein the sacrificial polymer comprises more than 50 mole percent of monomers of 5-(3-benzocyclobutylidene)-2-norbornene.

17. The method of claim 15, wherein the sacrificial polymer comprises more than 75 mole percent of monomers of 5-(3-benzocyclobutylidene)-2-norbornene.

18. The method of claim 15, wherein the sacrificial polymer consists essentially of monomers of 5-(3-benzocyclobutylidene)-2-norbornene.

* * * * *

UNITED STATES PATENT AND TRADEMARK OFFICE
CERTIFICATE OF CORRECTION

PATENT NO. : 7,598,114 B2  Page 1 of 1
APPLICATION NO. : 10/544428
DATED : October 6, 2009
INVENTOR(S) : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 604 days.

Signed and Sealed this

Twenty-eighth Day of September, 2010

David J. Kappos
*Director of the United States Patent and Trademark Office*